United States Patent [19]

Weber

[11] Patent Number: 6,154,102

[45] Date of Patent: Nov. 28, 2000

[54] CONTROLLABLE LC OSCILLATOR CIRCUIT

[75] Inventor: Stephan Weber, Munich, Germany

[73] Assignee: Infineon Technologies AG, Munich, Germany

[21] Appl. No.: 09/253,857

[22] Filed: Feb. 22, 1999

[30] Foreign Application Priority Data

Feb. 20, 1998 [DE] Germany .................. 198 07 255

[51] Int. Cl.[7] ............................. H03B 5/12; H03B 5/08
[52] U.S. Cl. ................................. 331/117 R; 331/167
[58] Field of Search .............................. 331/117 R, 167, 331/114, 181

[56] References Cited

U.S. PATENT DOCUMENTS 5,680,077  10/1997  Jonely et al. .................. 331/107
5,801,592   9/1998  Mann et al. .................... 331/109

OTHER PUBLICATIONS

"Amateur Radio Technique", Pat Hawker, Radio Society of Great Brian, , pp. 138–140.
"LC–Oscillator Mit Stromgegen–Kopplung", A. B. Bredshaw, Elektor, pp. 7–94, Jul./Aug. 1983.

Primary Examiner—Arnold Kinkead
Attorney, Agent, or Firm—Herbert L. Lerner; Laurence A. Greenberg; Werner H. Stemer

[57] ABSTRACT

A controllable LC oscillator circuit has a resonant circuit including an inductance and a capacitance disposed in parallel. The oscillator is driven by an amplifier and the inductance is produced using coupled coils. The effective inductance of the coupled coils can be set by changing a gain of the amplifier, and a magnitude of the coupling factor of the coupled coils defines a magnitude of an adjustable frequency band of the oscillator.

6 Claims, 2 Drawing Sheets

ABLE LC OSCILLATOR
CIRCUIT

BACKGROUND OF THE INVENTION

Field of the Invention

The invention relates to a controllable oscillator circuit that can be tuned, for example, to set a transmitter or to compensate for tolerances over a defined frequency band.

A known LC oscillator includes a tuned circuit made up of an inductance having a capacitance disposed in parallel therewith as well as a resistance and a negative resistance for attenuation cancellation. The negative resistance −R usually is an amplifier with positive feedback in practice.

To tune the LC oscillator of this type, use is usually made of a variable capacitance diode disposed in place of the capacitance. The disadvantage of using a variable capacitance diode is, firstly, that it is difficult to integrate it into an integrated circuit, and, secondly, the limited frequency band that is achieved, which is usually 10 to 25% of the resonant frequency. In addition, normal $P_n$ junctions in integrated circuits usually have poor characteristics in terms of the maximum tuning voltage, the series resistance, the shape of the characteristic curve and the capacitance variation.

SUMMARY OF THE INVENTION

It is accordingly an object of the invention to provide a controllable LC oscillator circuit that overcomes the above-mentioned disadvantages of the prior art devices of this general type, which has a tuning band which is as large as possible.

With the foregoing and other objects in view there is provided, in accordance with the invention, a controllable LC oscillator circuit, including: coupled coils defining an inductance; a capacitor connected in parallel with the coupled coils, the capacitor and the coupled coils defining an oscillator; and an amplifier driving the oscillator.

The effective inductance of the coupled coils can be adjusted by changing a gain of the amplifier. To achieve good oscillator characteristics, the amplifier is driven with a low impedance, and a low-noise amplifier is preferably used.

A magnitude of a coupling factor of the coupled coils defines a magnitude of an adjustable frequency band.

The LC oscillator with the coupled coils is preferably of symmetrical construction, so that the driving amplifier is configured and operates as a differential amplifier.

The controllable amplifier may also be an emitter follower.

Other features which are considered as characteristic for the invention are set forth in the appended claims.

Although the invention is illustrated and described herein as embodied in a controllable LC oscillator circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 3:
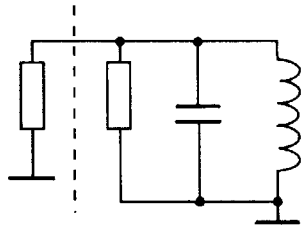
FIG. 3 is a circuit diagram of a prior art basic circuit.

In all the figures of the drawing, sub-features and integral parts that correspond to one another bear the same reference symbol in each case. Referring now to the figures of the drawing in detail and first, particularly, to FIG. 3 thereof, there is shown a known LC oscillator. The known LC oscillator includes a tuned circuit made up of an inductance $L_p$ having a capacitance $C_p$ disposed in parallel therewith as well as a resistance $R_p$ and a negative resistance −R for attenuation cancellation, the negative resistance −R usually is an amplifier with positive feedback in practice.

Figure 1:
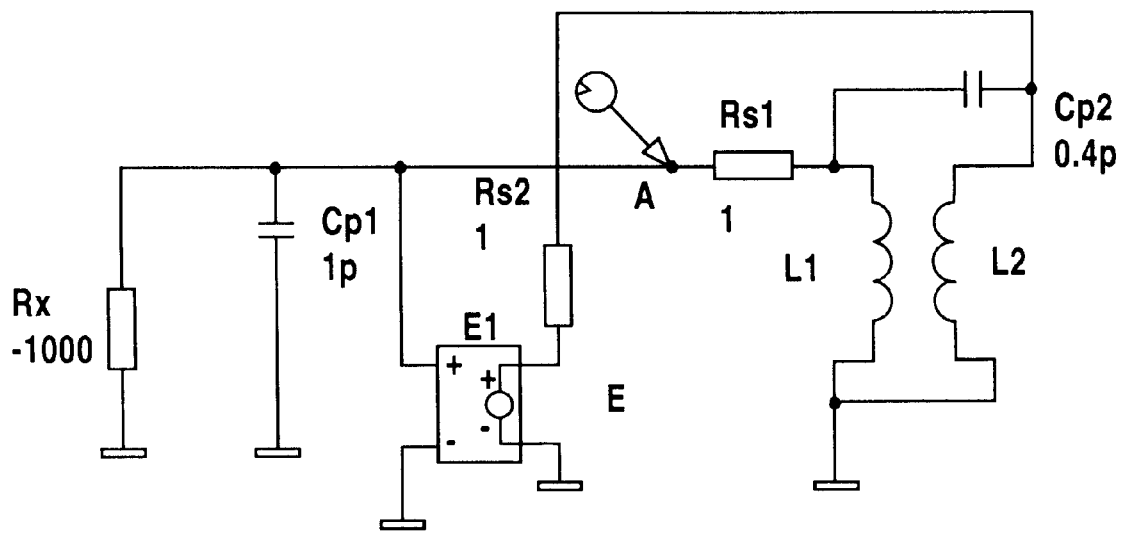
FIG. 1 is a diagrammatic circuit diagram of a basic circuit for a controllable LC oscillator circuit according to the invention.

FIG. 1 shows a basic circuit diagram for an LC oscillator circuit according to the invention. The LC tuned circuit is formed by a capacitance Cp1 and two coupled coils L1 and L2. An amplifier E drives the LC oscillator via the resistances Rs1 and Rs2, and the resistances Rs1 and Rs2 can represent the resistance losses of the coils L1 and L2. By changing the gain E1 of the amplifier E, an effective inductance of the coupled coils L1, L2 can be varied. In other words, changing the gain E1 can be used to adjust the effective inductance. In this case, a change in a resonant frequency of the controllable LC oscillator circuit becomes greater as the coupling factor of the coils increases. Since no variable capacitance diodes are used to adjust the frequency, fixed-value capacitors can be used, which have lower losses and are easier to produce in integrated circuits. In addition, the amplifier E should drive with as little noise and with as low an impedance as possible, so as not to impair the characteristics of the oscillator. A capacitance Cp2 serves to illustrate an unavoidable parasitic capacitance between the coils L1 and L2. Ideally, the capacitance Cp2 is not present. In a preferred embodiment, the inductance of each coil L1, L2 is 10 nH, for example, with a coupling factor of 0.9.

Figure 2:
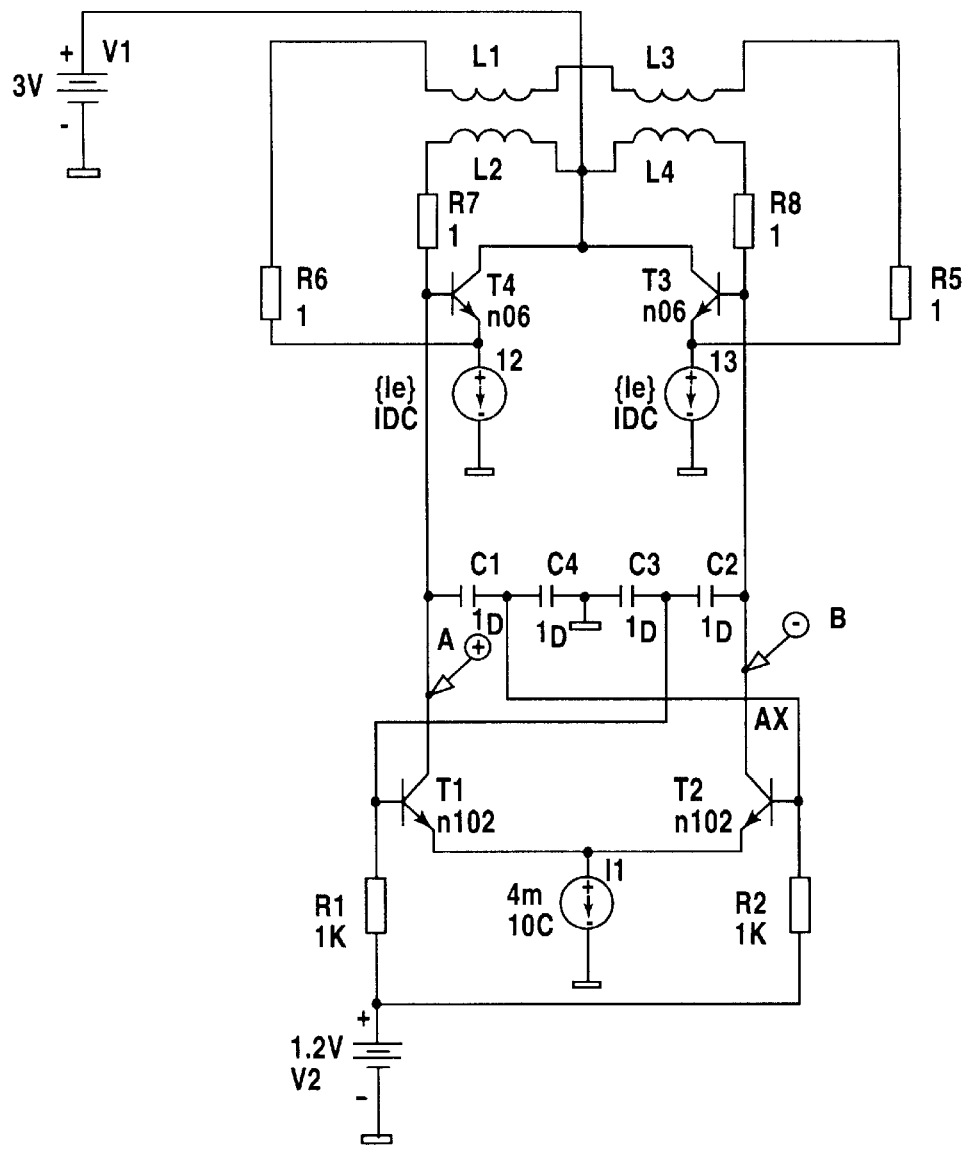
FIG. 2 is a circuit diagram of one possible embodiment of the controllable LC oscillator circuit.

FIG. 2 shows a preferred embodiment of the invention in which the controllable LC oscillator circuit, including coils L1, L2, L3 and L4 and capacitors C1, C2, C3 and C4, is operated symmetrically and the coupled coils L1 and L2 and, respectively, L3 and L4 are driven symmetrically by emitter followers T1 and T2. The coupling factor for the coils is 0.95, each coil L1, L2, L3 and L4 in this exemplary embodiment has an inductance of 10 nH. The oscillation is tapped off at points A and B. When using emitter followers T3 and T4, their voltage gain depends on the corresponding emitter current IE, so that a current-controlled oscillator circuit is produced. Each of the transistors T3 and T4 has a respective current source I2 or I3 in the emitter circuit. It is also possible to provide a number of amplifiers and emitter followers, for example N, which can also be connected to taps on the coils, so that an LC oscillator which can be switched digitally is produced if the appropriate current sources IE1 . . . IEN are made switchable. It is naturally also possible to produce combinations using continuous current sources or using additional capacitance diodes. In addition, pnp transistors or FETs may also be used as active elements or switches. Furthermore, to produce the necessary supply voltages, a network is provided which includes the transistors T1 and T2, a current source I1, the resistors R1 and R2, and a voltage source V2. In this embodiment, the voltage source V2 supplies +1.2 V. A center tap on the coupled coils L1, L2, L3 and L4 is connected to +3 V via an additional voltage source V1, while a center tap on the capacitance chain C1, C4, C3 and C2 is connected to ground. The controllable LC oscillator circuit according to this embodiment can be tuned in a band from 1 to 2 GHz when coils of 10 nH and the component sizes indicated in figures are used.

I claim:

1. A controllable LC oscillator circuit, comprising:

coupled coils defining an inductance;

a capacitor connected in parallel with said coupled coils, said capacitor and said coupled coils defining an oscillator tank circuit; and an amplifier driving said oscillator tank circuit;

said amplifier having a gain and said coupled coils having an effective inductance set by changing said gain of said amplifier.

2. The controllable LC oscillator circuit according to claim 1, wherein said amplifier is driven with a low impedance.

3. The controllable LC oscillator circuit according to claim 2, wherein said amplifier has a low noise level.

4. The controllable LC oscillator circuit according to claim 1, wherein said oscillator tank circuit has an adjustable frequency band, and said coupled coils having a coupling factor and a magnitude of said coupling factor defining a magnitude of said adjustable frequency band.

5. The controllable LC oscillator circuit according to claim 1, wherein said oscillator tank circuit is a symmetrically configured oscillator tank circuit and said amplifier driving said oscillator tank circuit operates as a differential amplifier.

6. The controllable LC oscillator circuit according to claim 1, wherein said amplifier is an emitter follower.

* * * * *